(12) United States Patent
Parikh et al.

(10) Patent No.: US 11,475,973 B2
(45) Date of Patent: *Oct. 18, 2022

(54) SYSTEMS AND METHODS FOR IMPLEMENTING REDUNDANCY FOR TILE-BASED INTELLIGENCE PROCESSING COMPUTING ARCHITECTURE

(71) Applicant: Mythic, Inc., Austin, TX (US)

(72) Inventors: Malav Parikh, Austin, TX (US); Zainab Nasreen Zaidi, Austin, TX (US); Sergio Schuler, Austin, TX (US); Natarajan Seshan, Austin, TX (US); Raul A. Garibay, Jr., Austin, TX (US); David Fick, Cedar Park, TX (US)

(73) Assignee: Mythic, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 17/331,095

(22) Filed: May 26, 2021

(65) Prior Publication Data
US 2021/0280266 A1 Sep. 9, 2021

Related U.S. Application Data

(63) Continuation of application No. 17/087,830, filed on Nov. 3, 2020, now Pat. No. 11,049,586.
(Continued)

(51) Int. Cl.
*G11C 29/44* (2006.01)
*G06F 12/1009* (2016.01)
*G11C 29/38* (2006.01)

(52) U.S. Cl.
CPC .......... *G11C 29/44* (2013.01); *G06F 12/1009* (2013.01); *G11C 29/38* (2013.01); *G06F 2212/657* (2013.01)

(58) Field of Classification Search
None
See application file for complete search history.

(56) References Cited

U.S. PATENT DOCUMENTS

| | | | |
|---|---|---|---|
| 4,314,349 A | 2/1982 | Batcher | |
| 8,711,156 B1* | 4/2014 | Acocella | G06F 12/1063 345/568 |

(Continued)

FOREIGN PATENT DOCUMENTS

| | | | |
|---|---|---|---|
| WO | 2018174936 A1 | 9/2018 | |
| WO | WO-2018174936 A1 * | 9/2018 | G06F 12/0207 |

OTHER PUBLICATIONS

International Application No. PCT/US2020/058673, International Search Report and Written Opinion dated Feb. 2, 2021, 8 pages.

*Primary Examiner* — April Y Blair
*Assistant Examiner* — Matthew W Wahlin
(74) *Attorney, Agent, or Firm* — Padowithz Alce; Alce PLLC

(57) ABSTRACT

A system and method for virtually addressing an array of accelerator tiles of a mixed-signal integrated circuit includes testing each of a plurality of distinct matrix multiply accelerator (MMA) tiles of a grid of MMA tiles, the grid of MMA tiles being defined by the plurality of distinct grid of MMA tiles being arranged in a plurality of rows and a plurality of columns along an integrated circuit, each of the plurality of distinct MMA tiles within the grid of MMA tiles having a distinct physical address on the integrated circuit; identifying one or more defective MMA tiles within the grid of MMA tiles based on the testing; and configuring the grid of MMA tiles with a plurality of virtual addresses for routing data to or routing data from one or more non-defective MMA tiles of grid of MMA tiles based on identifying the one or more defective MMA tiles.

20 Claims, 5 Drawing Sheets

Related U.S. Application Data

(60) Provisional application No. 63/003,433, filed on Apr. 1, 2020, provisional application No. 62/940,499, filed on Nov. 26, 2019.

(56) References Cited

U.S. PATENT DOCUMENTS

| | | |
|---|---|---|
| 10,521,395 B1 | 12/2019 | Fick et al. |
| 2019/0354146 A1 | 11/2019 | Steely, Jr. et al. |
| 2020/0174828 A1 | 6/2020 | Manula |
| 2020/0174851 A1 | 6/2020 | Manula et al. |
| 2020/0192971 A1 | 6/2020 | Lue et al. |

\* cited by examiner

200

IDENTIFYING A DEFECTIVE TILE S210

OPTIMIZING A VIRTUAL TILE ADDRESS MAP S220

ASSIGNING VIRTUAL ADDRESSES TO TILES S230

EXTENDING ROUTING ALGORITHM S240

WRITING TO A VIRTUAL TILE ADDRESS S310

ROUTING DATA USING VIRTUAL TILE ADDRESS S320

PROCESSING DATA AT DESTINATION TILE S330

FIGURE 3

SYSTEMS AND METHODS FOR IMPLEMENTING REDUNDANCY FOR TILE-BASED INTELLIGENCE PROCESSING COMPUTING ARCHITECTURE

CROSS-REFERENCE TO RELATED APPLICATIONS

This application is a continuation of U.S. patent application Ser. No. 17/087,830, filed 3 Nov. 2020, which claims the benefit of U.S. Provisional Application No. 62/940,499, filed 26 Nov. 2019, U.S. Provisional Application No. 63/003,433, filed 1 Apr. 2020, and U.S. Provisional Application No. 62/937,339, filed 19 Nov. 2019, which are all incorporated in their entireties by this reference.

TECHNICAL FIELD

The inventions described herein relate generally to the integrated circuitry architecture field, and more specifically to new and useful intelligent integrated circuits and methods of computing with the intelligent integrated circuit in the integrated circuitry architecture field.

BACKGROUND

Today, the various implementations of artificial intelligence and machine learning are driving innovation in many fields of technology. Artificial intelligence (AI) systems and artificial intelligence models (including algorithms) are defined by many system architectures and models that enable machine learning (deep learning), reasoning, inferential capacities, and large data processing capabilities of a machine (e.g., a computer and/or a computing server). These AI systems and models are often trained intensively to perform one or more specific tasks, such as natural language processing, image recognition, planning, decision-making, and the like. For example, a subset of these AI systems and models include artificial neural network models. The training of an artificial neural network model may, in many cases, require thousands of hours across the training cycle and many terabytes of training data to fine tune associated neural network algorithm(s) of the model before use.

However, once trained, a neural network model or algorithm may be deployed quickly to make inferences to accomplish specific tasks (e.g., recognizing speech from speech input data, etc.) based on relatively smaller datasets when compared to the larger training datasets used during the training cycle. The inferences made by the neural network model or algorithm based on the smaller datasets may be a prediction about what the neural network model calculates to be a correct answer or indication about a circumstance.

Still, while neural network models implementing one or more neural network algorithms may not require a same amount of compute resources, as required in a training phase, deploying a neural network model in the field continues to require significant circuitry area, energy, and compute power to classify data and infer or predict a result. For example, weighted sum calculations are commonly used in pattern matching and machine learning applications, including neural network applications. In weighted sum calculations, an integrated circuit may function to multiply a set of inputs ($x_i$) by a set of weights ($w_i$) and sum the results of each multiplication operation to calculate a final result ($z$). Typical weighted sum calculations for a machine learning application, however, include hundreds or thousands of weights which causes the weighted sum calculations to be computationally expensive to compute with traditional digital circuitry. Specifically, accessing the hundreds or thousands of weights from a digital memory requires significant computing time (i.e., increased latency) and significant energy.

Accordingly, traditional digital circuitry required for computing weighted sum computations of a neural network model or the like tend to be large to accommodate a great amount of digital memory circuitry needed for storing the millions of weights required for the neural network model. Due to the large size of the circuitry, more energy is required to enable the compute power of the many traditional computers and circuits.

Additionally, these traditional computers and circuits for implementing artificial intelligence models and, namely, neural network models may be suitable for remote computing processes, such as in distributed computing systems (e.g., the cloud), or when using many onsite computing servers and the like. However, latency problems are manifest when these remote artificial intelligence processing systems are used in computing inferences and the like for remote, edge computing devices or in field devices. That is, when these traditional remote systems seek to implement a neural network model for generating inferences to be used in remote field devices, there are unavoidable delays in receiving input data from the remote field devices because the input data must often be transmitted over a network with varying bandwidth and subsequently, inferences generated by the remote computing system must be transmitted back to the remote field devices via a same or similar network. Additionally, these traditional circuit often cannot manage the computing load (e.g., limited storage and/or limited compute) and may often rely on remote computing systems, such as the cloud, to perform computationally-intensive computations and store the computation data (e.g., raw inputs and outputs). Thus, constant and/or continuous access (e.g., 24×7 access) to the remote computing systems (e.g., the cloud) is required for continuous operation, which may not be suitable in many applications either due to costs, infrastructure limitations (e.g., limited bandwidth, low grade communication systems, etc.), and the like.

Implementing AI processing systems at the field level (e.g., locally at the remote field device) may be a proposed solution to resolve some of the latency issues. However, attempts to implement some of these traditional AI computers and systems at an edge device (e.g. remote field device) may result in a bulky system with many circuits, as mentioned above, that consumes significant amounts of energy due to the required complex architecture of the computing system used in processing data and generating inferences. Thus, such a proposal without more may not be feasible and/or sustainable with current technology.

Accordingly, there is a need for a deployable system for implementing artificial intelligence models locally in the field (e.g., local AI), and preferably to be used in edge devices, that do not result in large, bulky (edge) devices, that reduces latency, and that have necessary compute power to make predictions or inferences, in real-time or substantially real-time, while also being energy efficient.

The below-described embodiments of the present application provide such advanced and improved integrated circuits and implementation techniques capable of addressing the deficiencies of traditional systems and integrated circuit architectures for implementing AI and machine learning.

BRIEF SUMMARY OF THE INVENTION(S)

In one embodiment, a method for virtually addressing an array of accelerator tiles of a mixed-signal integrated circuit includes testing each of a plurality of distinct matrix multiply accelerator (MMA) tiles of a grid of MMA tiles, the grid of MMA tiles being defined by the plurality of distinct grid of MMA tiles being arranged in a plurality of rows and a plurality of columns along an integrated circuit, each of the plurality of distinct MMA tiles within the grid of MMA tiles having a distinct physical address on the integrated circuit; identifying one or more defective MMA tiles within the grid of MMA tiles based on the testing; and configuring the grid of MMA tiles with a plurality of virtual addresses for routing data to or routing data from one or more non-defective MMA tiles of grid of MMA tiles based on identifying the one or more defective MMA tiles.

In one embodiment, building a virtual address map for the grid of MMA tiles based on the testing of each of the plurality of distinct MMA tiles of the grid of MMA tiles, the virtual address map comprising: (1) a first set of valid tile addresses of the plurality of virtual addresses that are mapped to each of the plurality of distinct MMA tiles within the grid of MMA tiles that are identified as functional based on the testing; and (2) a second set of null tile addresses that are mapped to a plurality of distinct MMA tiles within a given row or a given column of the grid of MMA tiles that includes at least one of the one or more defective MMA tiles.

In one embodiment, a method for virtually addressing an array of computing tiles of an integrated circuit includes testing each of a plurality of distinct computing tiles of an array of computing tiles, the array of computing tiles being defined by the plurality of distinct computing tiles being arranged in a plurality of rows and a plurality of columns along an integrated circuit, each of the plurality of distinct computing tiles within the array of computing tiles having a distinct physical address on the integrated circuit; identifying one or more defective computing tiles within the array of computing tiles based on the testing; and configuring the array of computing tiles with a plurality of virtual addresses for routing data to or routing data from one or more non-defective computing tiles of the array of computing tiles.

In one embodiment, the method includes building a virtual address map for the array of computing tiles based on the testing of each of the plurality of distinct computing tiles of the array of computing tiles, the virtual address map comprising: (1) a first set of valid tile addresses that are mapped to each of the plurality of distinct computing tiles within the array of computing tiles that are identified as functional based on the testing; and (2) a second set of null tile addresses that are mapped to a plurality of distinct computing tiles within a given row or a given column of the array of computing tiles that includes at least one of the one or more defective computing tiles.

In one embodiment, configuring the array of computing tiles with the plurality of virtual addresses includes: (1) assigning a first subset of the plurality of distinct computing tiles with a plurality of distinct valid virtual address, and (2) assigning a second subset of the plurality of distinct computing tiles with a plurality of null virtual addresses, wherein the second subset of the plurality of distinct computing tiles comprise the one or more defective computing tiles.

In one embodiment, configuring the array of computing tiles with the plurality of virtual addresses includes: pairing each of the one or more defective computing tiles with a null virtual address that causes the one or more defective computing tiles to become unavailable as a routing destination for the data.

In one embodiment, the method includes identifying one or more non-defective computing tiles within the array of computing tiles based on the testing; configuring the array of computing tiles with the plurality of virtual addresses includes: pairing each of the one or more non-defective computing tiles in the array of computing tiles with one distinct virtual address of the plurality of virtual addresses.

In one embodiment, the method includes virtually removing each column of computing tiles within the array of computing having at least one defective computing tile as a virtual destination based on the identification of the one or more defective computing tiles in the array of computing tiles.

In one embodiment, configuring the array of computing tiles with the plurality of virtual addresses includes: pairing each of the plurality of computing tiles within each virtually removed column with an invalid virtual address that precludes the plurality of computing tiles within each virtually removed column from being virtually addressed.

In one embodiment, the method includes virtually removing each row of computing tiles within the array of computing having at least one defective computing tile as a virtual destination based on the identification of the one or more defective computing tiles in the array of computing tiles.

In one embodiment, configuring the array of computing tiles with the plurality of virtual addresses includes: pairing each of the plurality of computing tiles within each virtually removed row with an invalid virtual address that precludes the plurality of computing tiles within each virtually removed row from being virtually addressed.

In one embodiment, each of the plurality of null virtual addresses causes a defective computing tile having the null virtual address to continue to pass a data packet traveling in a first direction to a neighboring computing tile along the first direction.

In one embodiment, the method includes implementing a defect agnostic routing algorithm that acknowledges non-defective computing tiles as addressable computing tiles and ignores the defective computing tiles having a null virtual address as non-virtually addressable computing tiles.

In one embodiment, the defect agnostic routing algorithm implements dual addressing for interchangeably setting either a physical routing address or a virtual routing address for each data packet traveling into the array of computing tiles.

In one embodiment, configuring the array of computing tiles with the plurality of virtual addresses includes: at manufacture time of the integrated circuit, using one or more fuses to program virtual addresses for the array of computing tiles, wherein each of the one or more fuses stores an electrical charge corresponding to a distinct virtual address value.

In one embodiment, the null addresses sets to a virtually offline state each of the one or more defective computing tiles within the array of computing tiles preventing a routing of data to each of the one or more defective computing tiles using virtual addressing.

In one embodiment, the method includes configuring a sector control tile with one distinct virtual tile address of the plurality of virtual tile addresses, the sector control tile being in operable control communication with each of a plurality of distinct arrays of computing tiles of the integrated circuit, the one distinct virtual tile address enabling the sector control tile as a source or a destination of a data packet.

BRIEF DESCRIPTION OF THE FIGURES

FIG. 2 illustrates a method of determining virtual addresses for a tile array using an integrated circuit in accordance with one or more embodiments of the present application;

FIG. 3 illustrates a method of an application utilizing the virtual addresses for a tile array using an integrated circuit in accordance with one or more embodiments of the present application.

DESCRIPTION OF THE PREFERRED EMBODIMENTS

Figure 1:
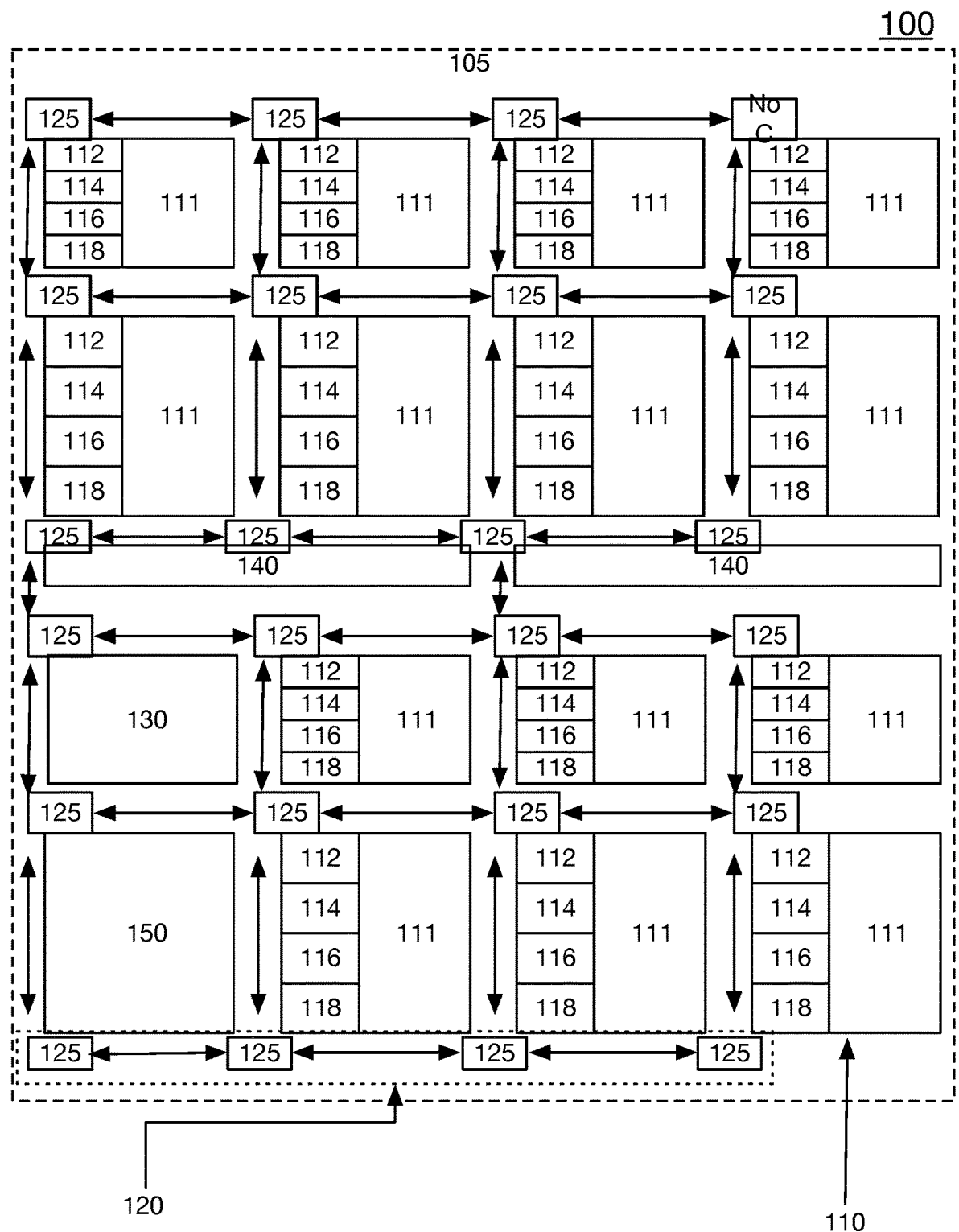
FIGS. 1-1A illustrates a schematic of an intelligence integrated circuit 100 in accordance with one or more embodiments of the present application.

The following description of preferred embodiments of the present application are not intended to limit the inventions to these preferred embodiments, but rather to enable any person skilled in the art of to make and use these inventions.

1. Intelligence Processing Overview

Embodiments of the present application provide a flexible and reprogrammable system that can be programmed to accommodate various computationally-intensive applications or programs of varying complexity and size. While a physical configuration of an integrated circuit architecture according to one or more embodiments of the present application may remain the same or substantially the same, disparate processing elements within the architecture may be programmed to handle multiple applications or one or more sections of a single application.

Further, an implementation and particular arrangement of the storage devices implemented within one or more embodiments of the present application provide several technical benefits over state-of-the-art integrated circuits, including reducing a total requirement of memory or storage required for handling data-intensive applications or programs. For instance, in one embodiment, a distributed memory may include a main (large) buffer may be provided to receive input data (e.g., raw input data or data from an upstream layer or source) and each of a plurality of disparate local buffers may be arranged together with a computing element (e.g., a matrix multiply accelerator) 111. In such embodiment, each local buffer may be arranged adjacent to or in an immediate vicinity of the computing element for fast access and therefore, efficient processing of input data from the main buffer.

Additionally, such an arrangement may allow for asynchronous processing of data along a data processing pipeline thereby enabling multiple segments of data to be processed at a same time and possibly in different stages along the pipeline. That is, in some embodiments, the asynchronous processing of data by the one or more components of the integrated circuit may enable a processing of a plurality of distinct sets of data that may not be in perfect lockstep while enabling simultaneous and/or parallel workflows along distinct components of a data processing pipeline. Such embodiments, the requirement for duplication of data may be significantly reduced.

Additionally, one or more embodiments of the present application may function to implement a token-driven data processing system in which a central process control may not be required.

Specifically, in one or more embodiments, an integrated circuit of the present application may include an architecture that may trigger microprocessor (e.g., a nano-processor which may include a microcontroller that may be local to each compute tile of an integrated circuit) programs and/or applications using tokens. A token as referred to herein preferably relate to a piece of data that evidences or represents an occurrence or an existence of a computing event or transaction and may, additionally or alternatively, evidence or represent a state of one or more components of an integrated circuit. In a non-limiting example, in the circumstances in which a token represents a state of an integrated circuit component, the token may indicate whether a buffer is empty or full, occupied or unoccupied, whether a processor is On or Off, busy (processing) or not busy (not processing), whether an item is processed or unprocessed, and/or the like. While, in many embodiments described herein, the tokens may be used for automatically triggering an execution and/or implementation of programs or applications, in various implementations the tokens may be used to trigger other units. A few examples include, using a combination of one or more instances or one or more tokens may indicate that an action or transaction of an integrated circuit has permission to proceed; possibly, meaning that all of the dependent actions of the action or transaction have occurred. Thus, the tokens may be used to trigger finite state machines, trigger a release of a packet or a work-queue item, trigger the generation of another token, and/or the like. There may be limitless applications of the token-based governance module (sometimes referred to herein as the flow scoreboard module), described in several of the embodiments, for automatically triggering any type and/or any number of functions/operations with the integrated circuit.

In a preferred embodiment of the present application, the integrated circuit architecture may include a network-on-chip system that enables a communication and/or passing of tokens between distinct components of the integrated circuit. Accordingly, in some embodiments, the tokens may represent pieces of dependencies that enable components of the integrated circuit to receive new workloads triggered by an appropriate combination and/or count of one or more tokens. However, it shall be noted that any suitable token communication scheme and/or interconnect may be used including, but not limited to, serial communication buses or the like. For instance, in one embodiment of the present application, a token may not be released and/or generated (irrespective of an interconnect) until an associated triggering event is completed (e.g., an emptying of a local data buffer, a computation by an MMA or the like against input data, and/or any suitable event). In yet another embodiment, a token may be generated and/or released in advance of an associated triggering event if the early release of the token would not cause ordering constraints to be violated. Accordingly, in several of the embodiments of the present application, it shall be noted that the tokens can be deployed in any suitable manner to achieve a token-based control of the flow of data and/or the processing of data throughout an integrated circuit.

Additionally, the token-based governance module described herein may generally function to enable a token-based control by tracking tokens and token triggering conditions and the like. The token-based governance module may have configurable constraints so that triggering may also depend on a state of a local unit or circuit and not only based on a number of tokens identified or received. That is, in several embodiments of the present application, data flow, data processing, one or more operations/functions and the like may be governed based on the release or generation of tokens, it shall be noted that simply determining and/or identifying a state of a component of the integrated circuit and/or identifying a state of a process or operation within the integrated circuit may serve as a triggering event for yet automating another operation, function, process, or flow. For instance, a state of the utilization (e.g., depth) and/or capacity of one or more work queues may function as a triggering event. A technical benefit of such embodiments may be that an operation may only run when computing resources (e.g., space with the one or more work queues) that may be required are available. Accordingly, the embodiments of the present application may provide a flexibility in how events and/or dependencies are configured that trigger an automated operation, function, or process and therefore, allow for the generation of more complex programs or applications that use greater resources or resources more efficiently, which improves an operating efficiency of the one or more systems described herein by reducing a number of events that need to be generated in order to perform some action.

It shall be noted that, in some embodiments, various and/or different tokens may be implemented by a token-based data processing integrated circuit, as described in more detail as in U.S. Pat. No. 10,606,797, which is incorporated herein in its entirety by this reference. In some embodiments, a triggering condition for performing an action within the integrated circuit may be achieved by a minimum number of counts of each of several distinct token types.

1.1 Redundancy System Overview

A tile based System-on-Chip (SoC) may include a grid/array of computing tiles where each tile is a functional block. The array of tiles may include a one-dimensional grid, a two-dimensional grid, a three-dimensional grid, any configuration that allows tiles to be assigned an address, and any combination of the aforementioned. The tile array may include tiles that are identical and tiles that are different. When all tiles in the tile array are identical, the tile based SoC may be said to be homogenous. When any of the tiles in the tile array are different, the tile based SoC may be said to be heterogenous. It shall be known that the grid/array of computing tiles may take on any suitable arrangement and/or suitable shape or size topology including, but not limited to, ring topologies, star topologies, and the like.

Each tile in the array may communicate with other tiles within the array via any communication scheme that allows the tiles to communicate. The tiles may be connected together to facilitate communication. In some embodiments, in a two-dimensional grid, each tile may be directly connected to two to four or more neighboring tiles. The communication scheme may be configured to be a network-on-chip (NoC) where each tile may contain a network router which implements a routing algorithm used by the SoC to route communication, e.g., a packet, between the tiles.

In traditional X-Y routing for a two-dimensional grid with a NoC, tiles may have physical (X, Y) coordinates where the X coordinate may specify a column address and the Y coordinate may specify a row address. A software program may emit data, e.g., a packet, to communicate between functional tiles where the data may contain the destination address of the tile. A routing algorithm may be used to route the data, e.g., packet, between tiles to the destination tile address.

A tiled SoC may include a plurality of grids having a plurality of tiles in each of the grids. Traditionally, when a defective tile is found, the software application may track the defective tiles and adjust the addressing scheme to account for the defective tiles thus possibly leading to a burden on the application. For example, the software may need to be recompiled for each integrated circuit depending on the number of defective tiles and/or the location of any defective tiles.

One or more embodiments of the present application teach methods and systems that may create a virtual addressing scheme that allows the application layer to route data, e.g., a packet, agnostic of the physical implementation of the grid or array of tiles. In one or more embodiments, once the defective tiles are known, valid virtual addresses, e.g., 1, 2, 3, etc., may be assigned to the functional tiles along with invalid virtual address, e.g., null, assigned to defective tiles. In such embodiments, the data may be routed within the array using the virtual addresses and when data arrives at a tile with an invalid virtual address, e.g., null, then the data may be passed along the array until the data arrives at a tile with a valid virtual address. In such embodiments, the application may only need to know the size of the virtual array and the physical layer may route the packets to functional tiles.

At least one technical benefit of virtual addresses may be that a good tile may be used to replace a defective tile in a manner that allows routing to be done by both hardware and software. Additionally, in these implementations, the software may not have to be recompiled for each integrated circuit depending on the number and/or location of defects. By adding the virtual addressing abstraction layer, a routing application may no longer be required to track defective tiles within an array/grid of tiles. In other words, the application layer may communicate with the array of tiles as if every tile were functional even though at the physical layer one or more defective tiles have been replaced with different functional tiles which are addressed virtually. In one or more embodiments, valid virtual addresses may only be assigned to rows and columns with functioning tiles while invalid virtual addresses may be assigned to rows and/or columns with non-functional tiles. At least one technical benefit of virtual addressing may be to improve yield of an integrated circuit and/or a recovery of a tile-based grid, albeit with a smaller functional array size.

According to one or more embodiments, the virtual addressing may allow the routing algorithm to retain at least part of the previous routing properties when implementing the virtual addresses. A routing algorithm may be extended to use virtual addresses in addition to physical addresses where the packet may specify the address space to use for routing, e.g., physical address or virtual address. In such embodiments, the software may use virtual addresses while the physical layer, e.g., firmware, may either use the physical address, virtual address, or both physical and virtual addresses.

For a non-limiting example, consider a 4×4 array of tiles where the origin may begin at (1,1) and the tile at (2,2) may have a defect. The physical address of each of the X columns may be [1,2,3,4] and the physical address of each of the Y rows may be [1,2,3,4]. It may be determined when assigning virtual addresses to the array to remove column 2 since column 2 contains a defective tile at (2,2) and removing column 2 may remove all the defective tiles within the array. Virtual valid addresses may be assigned incrementally, and removed rows and columns may be assigned a reserved address, e.g. 0 or null, as a virtual address. Each virtual column address may become [1, 0, 2, 3] where the zero represents the removed physical column 2 and each virtual row address may be [1, 2, 3, 4] where the row virtual address may be the same as the row physical address since no rows may have been removed from the virtual address space. At the application layer, the application may see the virtual array as a 3×4 array and write to the 3×4 array as if there are no defects in the array. At the physical layer, the data, e.g., packet, may be routed through the removed physical column 2. For a non-limiting example, if data, e.g., a packet, is at virtual address (1,1) and routed in the X increasing direction then at the physical address (1,2) it may be realized that this is not a valid virtual address and may be routed to the physical address (1,3) which has the virtual address of (1,2). This example may be illustrated with FIG. 4 and will be described in more detail in a following section.

2. Intelligence Processing Computing Architecture

Figure 1A:
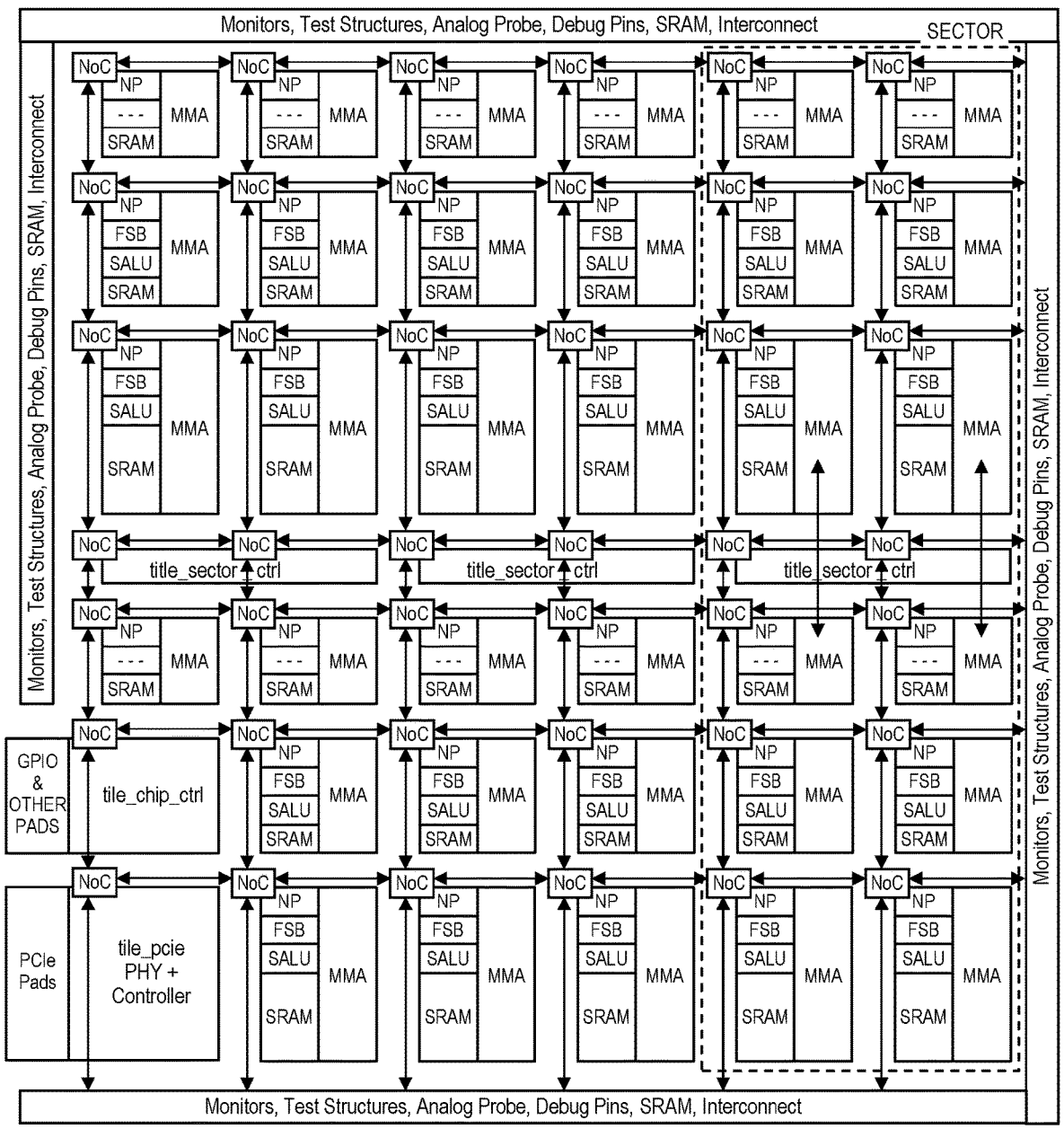

As shown in FIGS. 1-1A, an intelligence processing computing architecture 100 (or alternately referred to herein as an intelligence processing integrated circuit 100) for processing computationally-intensive programs and/or applications (e.g., machine learning applications, neural networks, etc.) includes an intelligence processing array 105 that includes a plurality of intelligence (computing) processing (tiles) units 110, a network on chip system 120 that includes a plurality of network-on-chip routers 125, an integrated circuit controller circuit 130, tile sector controller circuit 140 (sometimes referred to herein as a "sector control tile"), and a serial connection bus 150. Preferably, each of the plurality of intelligence processing units 110 includes a matrix multiply accelerator in (may also be referred to herein as an accelerator circuit), a computer processing circuit (e.g., a microprocessor, a nano-processor, or the like) 112, a flow scoreboard (token-based governance) module 114, a single instruction multiple data (SIMD) unit 116 (e.g., streaming arithmetic logic unit or the like), and a local buffer (e.g., static random access memory (SRAM) or the like) 118.

In some embodiments, a local data buffer 118 may be implemented by an SRAM controller that may include, at least, a SRAM storage or circuit, one or more data transfer engines or circuits (e.g., a DMA controller) that may be used to move data to and/or from the SRAM and other computing resources, an arbitration scheme that selects which controller has access to the SRAM at a given time. Additionally, in one preferred embodiment, each of 130, 140, and 150 may include a computer processing circuit 112, a flow scoreboard module 114, a SIMD 116, and a local data buffer 118. In one or more embodiments, the local data buffer 118 may sometimes be referred to herein as an on-tile memory or on-tile buffer indicating that the local data buffer 118 may be arranged within an intelligence processing tile 110 and in direct communication with various or one or more circuits, components, and/or modules within the intelligence processing tile no. FIG. 1A includes a further detailed embodiment of the intelligence processing computing architecture 100 and includes additional peripheral interconnects for interfacing with the intelligence processing array 105. For instance, test structures, monitors, analog probes, and/or any suitable peripheral device may be connected along or arranged along the periphery of the intelligence processing array 105 of the intelligence computing architecture 100.

While in one or more preferred embodiments an intelligence processing unit 110 may include a matrix multiply accelerator 111, a computer processing circuit 112, a flow scoreboard module 114, a SIMD unit 116, and a local buffer 118, it shall be noted that an intelligence processing unit 110 may include any suitable combination of circuits and modules and therefore, may exclude one or more of the aforementioned circuits and modules and/or may include any combination of the aforementioned circuits and modules without meaningfully departing from the scope of the inventions described in the present application. For instance, in some embodiments, an intelligence processing unit 110 may include or consist of a flow scoreboard module 114 and a local buffer 118 (SRAM) without computational circuitry or the like (e.g., computer processing circuit 112). In another example, an intelligence processing unit 110 may include or consist of a flow scoreboard module 114, a local buffer 118 (SRAM), and an off-chip interface (e.g., USB, PCIe, HDMI, MIPI-CSI, I2C, ethernet, Bluetooth, and/or any suitable off-chip interface component).

Additionally, or alternatively, while processing within the architecture 100 may include analog processing components or the like, it shall be noted that the embodiments of the architecture 100 may also enable digital processing with any suitable circuitry including, but not limited to, embedded Field Programmable Gate Arrays (eFPGA), Systolic arrays, floating point units, and/or the like.

The intelligence processing array 105 (intelligence accelerator) preferably includes the plurality of distinct intelligence processing units 110 that may function to work in cooperation to execute a computationally-intensive application or the like. In some embodiments, the intelligence processing array 105 may function to define one or more intelligence processing pipelines that enables a processing of raw input data and/or data from an upstream device or process to a final output state. In such embodiment, each stage (e.g., by one or more disparate intelligence processing units 110 or the like) of the intelligence processing pipeline may be defined by a disparate intelligence processing unit 110 that may be specifically programmed to execute a fraction of an application or program. Each of the disparate intelligence processing units 110 of the intelligence processing array 105 preferably functions to operate or compute independently of other or heterogeneous intelligence processing units 110 within the intelligence processing array 105. Accordingly, because each stage of an intelligence processing pipeline may be configured with its own processing section (e.g., intelligence processing unit 110), each intelligence processing pipeline may function to processing input data independently along each stage within the pipeline thereby enabling considerable efficiencies in processing input. That is, asynchronous processing of data or raw input data may be achieved based on the independent processing and/or computations of respective intelligence processing units 110.

Additionally, or alternatively, each of the one or more intelligence processing pipelines defined within the intelligence processing array 105 may be flexibly configured to enable the execution of disparate (non-dependent) applications or programs within the single array 105 or flexibly configured to enable the execution of disparate sections of a single application or a single program along various intelligence processing units 110 within the array 105. For instance, a first neural network application may be programmed along a first section of the intelligence processing array 105 that includes a first collection of intelligence processing units 110 and a second neural network application may be programmed along a second section of the intelligence processing array 105 that includes a second disparate collection of intelligence processing units 110. In a second example, a single computationally-intensive application (e.g., a neural network or the like) may be partitioned into sub-applications (or programs) and each section programmed to a different intelligence processing unit 110 within an array 105. Additionally, or alternatively, in this second example, multiple sections of an application or multiple sub-applications may be programmed to a same intelligence processing unit 110. In yet another example, a plurality of intelligence processing units 110 may be conglomerated to perform one or more sub-sections of a single application or a single program. That is, individual intelligence processing units 110 may be used to implement only a section of an application or a program and thus, the entirety of the application or the program is handled by a plurality of intelligence processing units 110 that each process only a section of the overall application or program. It shall be noted that the integrated circuit array 105 and/or each intelligence processing units 100 may function to compute the multiple distinct applications and/or the multiple distinct partitions of a single application or single program in parallel (i.e., at the same time), contemporaneously (i.e., processing within a common time period, nearly the same time, etc.), or synchronously (i.e., processing independently of other processes and/or processing units 110). Additionally, it shall be noted that any suitable and/or type of application or program may be partitioned along the intelligence processing array 105 including applications and/or programs that may be partitioned into multiple operational stages that may have dependencies that can be represented as tokens.

The plurality of intelligence processing (tiles) units 110 preferably function to execute an application or a program against some input data received from an upstream device or an upstream layer, such as a buffer or another intelligence processing unit 110. As mentioned above, each of the plurality of intelligence processing units 110 includes a matrix multiply accelerator (e.g., a data processing circuit, or the like) 111, a computer processing circuit (e.g., a microprocessor) 112, a flow scoreboard module 114, a SIMD unit 116, and local data buffer 118 that enables each of the plurality of intelligence processing units 110 to accomplish and/or complete a processing of input data to output data and/or execute an application or program.

Each of the plurality of intelligence processing units 110 preferably functions to pull and/or accesses input data from its local buffer 118, compute against the input data at the matrix multiply accelerator 111 and output the results (output data) of the computation against the input data back into its local buffer 118 (or possibly to a local buffer of a downstream component or processing section).

In additionally and/or alternative embodiments of the present application, one or more distinct subsets (i.e., two or more) of the plurality of intelligence processing units 110 of the intelligence array may be clustered and/or conglomerated into a smaller chip (e.g., a chiplet, a system-in-a-package (SIP), 3D packaging, or the like) relative to the overall architecture 100. In such embodiments, a chiplet may be composed within the overall architecture 100 to make a full and/or independent chip. A technical benefit of such embodiments enables an enhanced level of customization of the architecture to be achieved.

In yet further embodiments, multiple integrated circuit architectures 100 may be combined and/or packaged together in a multi-chip architecture. In such embodiments, the multiple architectures 100 may be composed at a system or circuit board (panel) level. The interconnections between the multiple chips may be made using any suitable interconnect technique or interface, including PCIe or specially created bridge interfaces.

The flow scoreboard module 114 is preferably implemented by a combination of one or more computing processing circuits and flow scoreboard sub-modules. Additionally, the flow scoreboard module 114 may include a plurality of interfaces for implementing a flow control of data flowing through the one or more intelligence processing pipelines and a control of the execution of programs or the applications being handled by the one or more intelligence processing pipelines of the intelligence processing array 105.

In a preferred embodiment, the flow scoreboard module 114 may include a configuration interface, a token interface, and a notification interface. The configuration interface of the flow scoreboard 114 may be used to read and write an internal state of the flow scoreboard module 114, such as to program trigger conditions that when satisfied, in some embodiments, causes the integrated circuit via a nanoprocesor or the like to initiate a workload. The token interface of the flow scoreboard 114 may enable the intelligence integrated circuit 100 to present tokens to the flow scoreboard 114. In response to the presentation of a token via the token interface, the flow scoreboard 114 may function to update its internal state, and when necessary, update the notification interface according to token parameter values and a configuration of the flow scoreboard 114. The notification interface of the flow scoreboard may be implemented by the flow scoreboard module 114 to indicate to the intelligence integrated circuit 110 that one or more conditions (or prerequisites) for executing one or more programs have been satisfied. It shall be noted that the notification interface of the flow scoreboard module 114 may function to trigger any number of operations within the intelligence integrated circuit 110, for example, data transfer without an explicit program execution.

It shall be noted that the configuration interface, token interface, and/or notification interface may be implemented in any suitable manner including with a combination of modules executed by one or more processing circuits, such as a microprocessor.

The network on chip system 120 that includes a plurality of network-on-chip routers 125 that function to establish a communication network between the disparate components of the intelligence integrated circuit 100. In one embodiment, each of the chip routers 125 may include dedicated input and output links for receiving and transmitting communications in the North, South, East, and West directions along the architecture 100 and specifically, within the intelligence processing array 105. In some embodiments, the network on chip system 120 enables each of the disparate intelligence processing units 110 to pass data between them, such that when one intelligence processing unit 110 completes processing input data to generate an output, the one intelligence processing unit 110 may function to pass the output via one or more of the network routers of the network on chip system to another intelligence processing unit and/or allow another intelligence processing unit 110 to grab the output data. As one example, the digital tokens and/or data packets may be carried along the plurality of network routers of the network on chip system 120.

The integrated circuit controller 130 preferably includes chip-level control logic, which includes boot logic, security features, clocking logic, and the like.

The tile sector controller circuit 140 preferably includes a high voltage portion or circuit of the intelligence processing computing architecture 100 that enables the reprogrammable non-volatile memories within the matrix multiply accelerator 11.

The serial connection bus 150 preferably includes one of a universal serial bus (USB) port and a peripheral component interconnect express (PCI express) interface and/or any suitable high-speed. In a preferred embodiment, raw input data (e.g., raw image data or the like) and/or processed input data (e.g., from an upstream device, an upstream layer, etc.) may be received at the serial connection bus 150 and passed into the system via a primary or main buffer component.

Additionally, or alternatively, input data received at the serial connection bus 150 may be passed either into a primary buffer of the intelligence processing integrated circuit 100 or directly into a local buffer 118 of an intelligence processing unit 100 via the network on chip system 120. Additionally, or alternatively, the primary buffer, which is sometimes referred to herein as a main buffer, may also be referred to as an off-tile (off-unit) memory or buffer. In particular, since the main buffer operating with the architecture 100 may be arranged remotely from and off of an intelligence processing tile no, it may be considered an off-tile component.

Additionally, or alternatively, any suitable off-chip connection may be implemented for transmitting data into and/or out of an intelligence processing array 105 and/or throughout the intelligence integrated circuit 100. For instance, any suitable peripheral device including, but not limited to, an imaging device (e.g., a camera or image sensor), a host system (e.g., a system on chip) or workstation, another intelligence integrated circuit, and/or the like.

Accordingly, it shall be noted that any type or kind of data including tokens may be passed along the serial connection bus 150 or other suitable off-chip connection/interface. For instance, data (e.g., results of computations or other outputs, etc.) from the intelligence integrated circuit 100 may be sent out to another device or system via the serial connection bus 150 or off-chip connection. Thus, a flow control, as described in the one or more embodiments herein, may be extended from the intelligence integrated circuit 100 to other devices, when operably connected or interfacing, in some manner. That is, in some embodiments, token-based flow control may be enabled between multiple intelligence integrated circuits 100 or between a device and host.

3. A Method for Virtually Addressing a Tile-Based Integrated Circuit

As shown in FIG. 2, a method 200 implementing virtual addressing in a mixed-signal integrated circuit may include identifying one or more low-performing/defective tiles within a grid/array S210, optimizing a virtual addressing map/configuration S220, and mapping virtual addresses to each of a plurality of functional (i.e., good tiles) tiles along a grid/array of tiles S230. The method 200 may optionally, or alternatively include modifying or extending a data routing application with virtual addressing routing capabilities S240.

In one or more embodiments, when there are no low-performing/defective tiles in an array or grid of processing tiles, the virtual addresses may be the same as the physical addresses. According to one or more embodiments, even though a tile-based grid as a whole is indicated as low-performing or as having one or more defective processing tiles, functioning sub-blocks within the tile-based grid may still be utilized to perform mixed-signal computation.

3.1 Identifying Deficient Computing Tiles

S210, which includes identifying one or more low-performing/defective tiles within a grid/array, may function to test one or more mixed-signal integrated circuits, e.g., tiles. Certain computing tiles within the grid may be considered low-performing/defective for any reason that causes the array to perform below system requirements such as silicon defects in circuitry, performance below a performance threshold, lower performance compared to other computing tiles, using excessive power (above an energy usage threshold), energy efficiency below a threshold, and the like. A silicon defect may occur anywhere within the integrated circuit including, but not limited to, embedded SRAM, NVRAM, digital circuitry, analog circuitry, mixed-signal circuitry, and/or any suitable circuit or computing feature of an integrated circuit.

In a preferred embodiment, even though part of a tile may be low-performing/defective, the tile may continue to interface with neighboring tiles (using the NoC routers or the like) to continue to pass or route data along the grid. That is, while a given tile may be designated as defective and/or not available for processing or computing, routing capabilities of the defective tile may remain intact such that S210 may additionally designate the tile for continued data packet routing along a grid of tiles.

For testing mixed-signal integrated circuits, reference is made to U.S. Provisional Patent Application 62/937,339 filed on 19 Nov. 2019 titled "SYSTEMS AND METHODS FOR STRUCTURAL TESTING OF A TILE-BASED ARCHITECTURE OF A MIXED-SIGNAL INTEGRATED CIRCUIT", which is incorporated in its entirety by this reference. It shall be noted that any suitable scan testing system, automatic testing equipment, and/or circuit testing technique may be implemented by the method 200 for testing for defects in any of the circuitry and/or processing tiles of a given integrated circuit, described herein or otherwise.

In one or more embodiments, identification of one or more low-performing/defective tiles within a grid/array may involve determining whether a total number of defective tiles, if any, within a subject grid/array exceeds a defect threshold or satisfy a utility threshold for the subject grid/array of computing tiles. The defect threshold preferably relates to a maximum number of defective or low-performing computing tiles that may be detected or identified within a subject grid/array of computing tiles of an integrated circuit that, if exceeded, designates the grid or array as unsuitable for virtual addressing since a yield of such a grid or array may not be sufficient for any suitable for implementing any of one or more subject applications by the grid or array. In one or more embodiments, the utility threshold preferably relates to a minimum number of non-defective or functional computing tiles within a grid or an array of computing tiles for implementing one or more subject applications. Accordingly, the utility threshold or utility requirement, if satisfied, may indicate that a subject grid or array of computing tiles may be suitable for use with one or more target applications and in response, may function to automatically cause a virtual addressing of the defective and non-defective computing tiles within the grid or array. That is, a subject grid having the maximum number of non-defective or functioning computing tiles may be considered a good or viable grid/array that may be used in production.

In one or more embodiments, the defect or utility threshold may be dynamic and preferably set or based on minimum tile requirements of a given application, program, algorithm, and/or the like that intends to execute some part along a subject grid/array of tiles. In a non-limiting example, if a given software application requires a minimum of twelve (12) functional tiles to execute or operate along a given grid/array having sixteen (16) computing tiles, the defect threshold may be set to four (4) or the utility threshold may be set to twelve. It shall be noted that the defect or utility threshold may be set to any suitable value and may be different for each distinct grid/array of a given integrated circuit.

According to one or more embodiments, after determining that a tile is low-performing/defective or non-functional for computing or processing purposes, the tile may be indicated and/or designated as being low-performing/defective tile. This indication may be done in software, firmware, hardware, and any combination of the aforementioned. As a non-limiting example, a low-performing/defective computing tile or an undesired computing tile may be indicated as disabled, unavailable, reserved, restricted, and any other way to indicate the tile as low-performing/defective or otherwise, a computing tile that may not be necessary for implementing a given application or process within the integrated circuit.

3.2 Computing and/or Building a Virtual Address Mapping

S220, which includes optimizing a virtual addressing map/configuration, may function to determine and/or compute an optimal virtual address mapping and/or virtual address configuration of a subject grid/array of tiles. In one or more embodiments, S220 may function to optimize the virtual address mapping and/or virtual address configuration to maximize a number of computing tiles within a subject grid that may be available for processing and/or computing against a data packet and simultaneously minimizing a number of defective and/or non-defective tiles that may be put (virtually) offline or modified to a lesser state of operating, such as enabling routing properties only and no processing or computing.

In one embodiment, the optimal virtual address mapping includes a layout and/or floorplan that includes one or more of an identification of each distinct computing tile along a grid, an identification of each computing tile receiving a valid virtual address, an identification of each computing tile receiving a null or invalid virtual address, a physical address of each computing tile, and/or the like.

According to one or more embodiments, the computing tile array virtual addressing may be determined such that the tiles that perform at or above a performance threshold may be assigned virtual addresses while the low-performing/defective tiles may be assigned reserved virtual addresses, e.g., 0 or null virtual addresses, that may cause the routing algorithm to continue through and/or to skip over any defective tile having a null address. In one or more embodiments, the virtual addresses may be configured such that the low-performing/defective tiles may be replaced with redundant tiles thus making the virtual array appear to an application layer as if the array has no defects. The virtual addresses may create a virtual address abstraction layer for the physical layer that is agnostic of the physical implementation and/or software application running or being executed by the physical layer.

Additionally, or alternatively, S220 may function to identify or determine whether a columnar and/or a row shift in the virtual addresses may be required based on one or more optimization requirements and/or routing requirements of a given routing scheme/algorithm. In some embodiments, a routing algorithm may be implemented by an integrated circuit that restricts a travel path of a data packet along a grid to include a single turn, e.g., wormhole X-Y routing. In such embodiments, a virtual address mapping or configuration over a grid/array of tiles may include a mapping that includes a columnar shift or a row shift of virtual address values to reduce a complexity in routing a data packet that is routed using a turn-restricted or single-turn routing algorithm. In such embodiments, the columnar shift or row shift of virtual address may cause a misalignment between same value virtual addresses and physical addresses, such that virtual address value (e.g., 2,2) may fall out of alignment with a physical address value (e.g., 2,2) and instead be shifted away from the physical address value in a column or row direction. That is, a typical position of virtual address values along a single row or along a single column may be moved in a row direction or a column direction, respectively to reduce a complexity of routing.

It shall be noted that, in one or more embodiments, granular remapping and/or granular routing shifts away from defective tiles to good tiles may be performed on an individual tile basis. That is, rather than replacing or shifting from an entire row or column, in one or more embodiments of the present application, only the distinct and/or individual defective tiles may be mapped to null or invalid virtual addresses and remaining good or non-defective tiles along a row or a column having the defective tiles on a grid may be assigned valid virtual addresses.

According to one or more embodiments, creating the virtual address mapping may include determining the mapping such that the minimal number of tiles become unavailable to be used in mixed-signal computing (i.e., maximizes the number of tiles available based on detecting one or more defective tiles). Thus, in such embodiments, S220 may function to optimize a virtual address mapping of a given grid of computing tiles to reduce a total number of computing tiles that are provided a null or an invalid virtual address based on identifying whether to remove or nullify one of an entire row and an entire column of computing tiles in which there is at least one defective computing tile. Stated alternatively, S220 may function to optimize a virtual address mapping to increase a total number of functional or non-defective computing tiles available for valid virtual addresses. Any suitable algorithm that may determine a mapping between physical tile addresses and virtual tile addresses of a grid/array of tiles may be implemented.

According to one or more preferred embodiments, the virtual addressing configuration may be determined by virtually removing or virtually nullifying a minimal number of rows and columns of tiles from the array of tiles. As a non-limiting example, if two defective tiles of a subject grid are in the same column then two possible solutions would be to remove both rows that include the defective tiles are on and another solution would be to remove the single column that contains both defective tiles. In this situation, S220 may function to optimize a virtual address configuration of the subject array by removing the single column that includes both defective tiles instead of two rows since the overall size of the usable array of tiles is larger when only a single column is removed verses a smaller array when two rows are removed. As a more detailed non-limiting example, when a 5×5 tile array with the origin at (1,1) may have indicated tiles at (2,1) and (2,5) then to remove the indicated tiles either the row 1 and row 5 can be removed, or column 2 can be removed. In this particular situation, removing 1 column reduces the array to 4×5 compared to removing 2 rows which reduces the array to 5×3 thus it may be preferable to remove 1 column creating an array of 4 columns*5 rows=20 usable tiles other than remove 2 rows which creates an array of 3 columns*5 rows=15 usable tiles. In one or more embodiments, when multiple minimal solutions to the virtual mapping has been found, the final mapping may be determined by randomly picking a solution, using a preference setting (e.g., more columns may be preferable over more rows), select the first solution, or any other method to select a single solution from multiple possible solutions.

3.3 Assigning Virtual Addresses

S230, which includes mapping virtual tile addresses to each of a plurality of functional tiles (i.e., good tiles) along a grid/array of computing tiles, may function to assign virtual tile addresses to each of a plurality of computing tiles of the array of computing tiles based on the virtual address mapping. In one or more embodiments, the virtual tile addresses may include functional or valid virtual tile address and non-functional or null virtual tile addresses.

In some embodiments, the virtual tile addresses may be superimposed onto the tile array (i.e., creating a layer of abstraction) while retaining the physical tile addresses of the plurality of tiles within the array thus allowing both the physical tile addresses and the virtual tile addresses to exist and be used in reaching a tile. Thus, S230 may effectively function to create virtual/physical address pairs at each of the plurality of tiles of a given grid or array of computing tiles. In such embodiments, the virtual/physical address pairs may be used dynamically and selectively by either software applications or programs and firmware operating on a given integrated circuit to route data along the given grid.

In a preferred embodiment, S230 may function to assign and/or map virtual tile addresses only to grids/arrays of tiles having one or more defective tiles, as detected in S210. However, it shall be recognized that S230 may function to assign and/or map virtual tile addresses to both fully functional grids including fully functional grids without defective tiles and to non-fully functional grids with one or more defective tiles. In one or more embodiments in which virtual tile addresses are assigned and/or mapped to the grids/arrays having one or more defective computing tiles may result in a heterogenous tiled-based SoC whereas a grid or an array of computing tiles that may not require virtual addressing (i.e., without a defect) may be routed-to using physical tile addresses. It shall be noted that, in some embodiments, the method 200 may function to route to or address a defective computing tile using its physical tile address within an array even if the defective computing tile has a null or invalid virtual address.

Additionally, or alternatively, S230 may include assigning reserved tile addresses, e.g., null, to one or more low-performing/defective tiles within the array of tiles. The reserved address may be an integer, float, negative integer, negative float, null, zero, character, string of characters, constant voltage, ground, or any other representation that shows the one or more distinct tiles within a row or a column should not be addressed for data packet processing when using virtual addressing and/or may further indicate that defective or non-functional tiles having a null virtual address may be offline for data processing only but available for data packet routing.

In a preferred embodiment, the virtual addressing may have an origin of (1,1), which avoids a use of the null address of (0,0). In another preferred embodiment, the reserved address may be (0,0) which may not be a valid address in either the physical address space, the virtual address space, or both the physical and virtual address space. Thus, the null address may be an invalid address that merely operates as a placeholder and, in some embodiments, an indicator that a tile having a null address cannot and/or should not be used as a valid destination for a data packet or the like.

According to one or more embodiments, virtual addresses may be assigned using the virtual address map created in S220. In a preferred embodiment, columns and rows of computing tiles that may be determined to be removed by the virtual address mapping may be assigned a null address of (0,0) for each tile in the designated row and/or column. In the alternative, the designated rows/columns of computing tiles may be assigned an address of null or no virtual address at all. Thus, S230 may function to use any suitable annotation, augmentation, or null addressing to identify a defective computing tile within a grid/array of computing tiles to a given routing algorithm or software application operating with a given grid or given array of computing tiles.

Additionally, or alternatively, S230 may function to assign virtual addresses to non-defective tiles in a linear fashion, such that the virtual tile address values are serially incremented along each adjacent until a top/bottom of a column direction or an end of a row is reached.

Additionally, or alternatively, S230 may function to assign one or more valid virtual tile addresses to one or more sector control tiles of a given integrated circuit. In such embodiments, a sector control tile having a valid virtual tile address or the like may be a source or a destination of a data packet. That is, in one or more embodiments, a virtually addressed sector control tile may initiate a data packet for routing and identify a virtual address as a destination. Additionally, the virtually addressed sector control tile may be a virtual destination of a data packet for processing the data packet.

In a preferred embodiment, S230 may function to program and/or reprogram virtual tile addresses using fuses at a time of manufacturing a tile-based integrated circuit. In such embodiments, S230 may function to store an electrical charge or the like with a fuses that carries a virtual address value for a given computing tile. In one or more embodiments, the virtual addresses may be stored in software such as firmware, memory, or any other digital media. Additionally, or alternatively, the virtual addresses may be scanned in, loaded from off chip, or retrieved in any other way that allows a mixed signal computing device to be loaded. In one or more embodiments, the virtual address may be stored in the tile by storing bits within the tile along with logic to process the virtual address. In one or more embodiments, the virtual addresses may be programmed into the integrated circuit chip by using a non-volatile structure embedded within the integrated circuit chip such as a fuse, a non-volatile memory, and the like. According to one or more embodiments, each row and column determined to be removed by the virtual mapping may include a fuse that may cause the routing to that tile to be bypassed thus causing data, e.g., packets, to be passed though the block without the packets being evaluated. Additionally, or alternately, the virtual addressing may be changed dynamically.

3.4 Routing Algorithm Extension

Optionally, or alternatively, S240, which includes modifying or extending a data routing application with virtual addressing routing capabilities, may function to augment and/or change a standard routing algorithm to recognize and/or use virtual tile addresses for routing data packets along a given grid. That is, in some embodiments, a traditional or standard routing algorithm for integrated circuits may function to use only physical tile addresses for passing data along tiles of a grid. S240 may function to extend the virtual addressing mechanism described herein such that the routing algorithm may be capable of addressing and/or provide tile destinations using either or both virtual tile addresses or physical tile address.

In a non-limiting example, S240 may function to inform a routing algorithm with a virtual tile address map for a given grid of an integrated circuit. Once informed with the virtual tile address map, the routing algorithm may selectively generate data packet destinations (e.g., data packet headers) using virtual tile addresses if a proposed tile destination traverses one or more defective tiles or null tile addresses. Thus, in some embodiments, capabilities of a routing algorithm may be extended such that the routing algorithm or application may function to selectively determine whether a suitable destination for a given data packet should be generated with a virtual address or a physical address when a virtual tile address map is detected for a given grid. In other embodiments, when a virtual tile address map is detected, the routing algorithm may be modified or additionally configured to automatically implement the virtual tile address map for routing data packets along an associated grid.

4. Tile Defect Agnostic Packet Routing Method

As shown in FIG. 3, a method 300 implementing virtual address routing in a mixed-signal integrated circuit may include an application that writes to address S310, physical layer routes data using virtual address S320, and destination tile process data S330.

4.1 Application Writes to Array with Virtual Address

S310, which includes writing to array of tiles, may function to allow an application to write data using a virtual address to one or more functional blocks, e.g., tiles. In a preferred embodiment, from the application layer standpoint, the application may write to an address without knowing if a physical address or a virtual address is used in the physical layer (e.g., hardware and/or firmware). In other words, the hardware and/or firmware implementation is being abstracted away from the application layer by the physical layer. In one or more embodiments, the application may use physical addresses.

In a preferred embodiment, the data, e.g., packet, may specify the addressing scheme used, e.g., physical address and/or virtual address. In a preferred embodiment, the mixed-signal integrated circuit functional blocks that have redundancy, e.g., tiles, may have virtual address along with a physical address, and the functional blocks without redundancy, e.g., an SoC interface to the external world without redundancy (e.g., a PCIe or the like), may have a physical address. In one or more embodiments, the application layer may use the physical address of functional blocks. In one or more embodiments, a tile may send data to another tile using virtual addresses, physical addresses, or a combination of virtual and physical addresses.

4.2 Physical Layer Routes Data Using Virtual Address

S320, which includes a physical layer to route data using virtual addresses, may function to route the data, e.g., packet, between tiles using the virtual address until the destination address is reached. In one or more embodiments, a physical address may be used in conjunction with a virtual address or in place of a virtual address. In one or more embodiments, the firmware may use the physical address, the virtual address, or both physical and virtual address. In a non-limiting example, to aid in diagnostics of a grid or array of tiles, firmware may use the physical addresses associated with each tile within the grid or array.

In a preferred embodiment, the data may be routed between tiles using a routing algorithm along with the virtual address. Should the data be at a tile other than the destination, the routing algorithm may determine the next tile the data may be routed to. For a non-limiting example, when a wormhole routing algorithm is used, the data may first move along a row, e.g., x direction, until the data reaches the column that contains the destination tile and then moves along the column, e.g., y direction, until the destination is reached. In the alternative, the wormhole routing algorithm may first route in the y direction and then route in the x direction. A technical advantage of using wormhole routing with a virtual address may be that the deadlock free property of the wormhole algorithm may be kept. Any routing algorithm may be used that allows routing between tiles in an array using a virtual address, e.g., west first, north last, negative first.

According to one or more embodiments, as the data arrives at a tile the destination tile address may be compared to the virtual address of the tile. When the tile virtual address is the same as the destination virtual address, S330 may be performed, otherwise the next tile to route to may be determined by the routing algorithm and the data transmitted to the next tile. In a preferred embodiment, when the data arrives at a tile that does not have a valid virtual address, e.g., null, then the data route may be continued in the same direction as before entering the tile.

Figure 4:
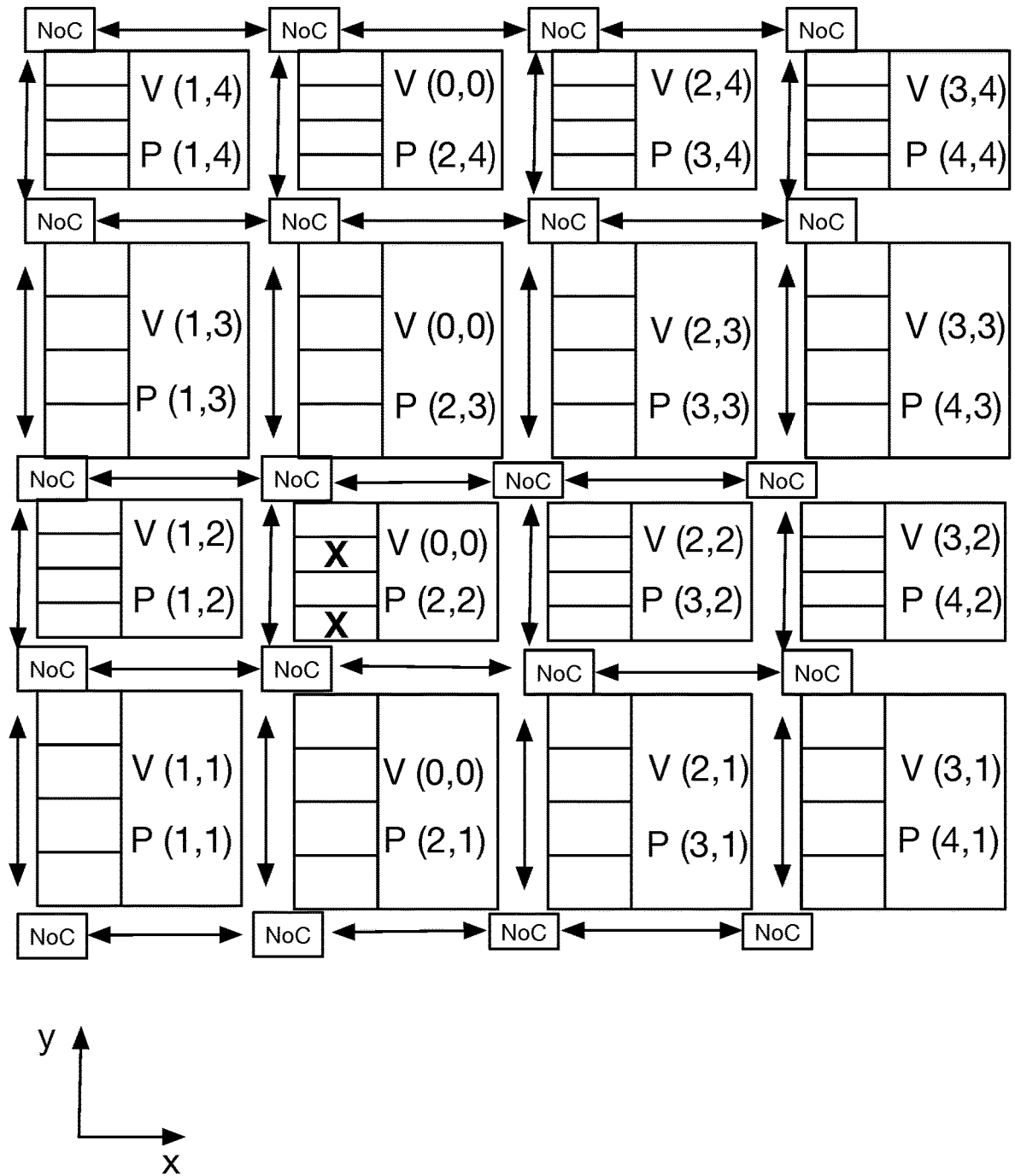
FIG. 4 illustrates a non-limiting example of determining virtual addresses for a tile array using an integrated circuit in accordance with one or more embodiments of the present application.

As a non-limiting example, routing data within the tile array shown in FIG. 4 using virtual addresses may be illustrated. In this example, an application may have instructed the data at tile with virtual address (1,1) to be routed to the tile with virtual address (3,4). As discussed above, physical column addresses [1,2,3,4] may have virtual column addresses [1,0,2,3], respectively, where 0 represents a reserved column address and physical rows [1,2,3,4] have virtual row numbers [1,2,3,4] for at least the first, third, and fourth columns and virtual row numbers [0,0,0,0] for the second column, respectively. From a high-level standpoint, the data may be routed along the virtual row 1 in the increasing x direction until the data reaches virtual column 3 at which time the data will be routed in the increasing y direction until the data arrives at the destination of virtual address (3,4). Again, at the high-level, when a tile without a valid virtual address is reached on the physical level, e.g., physical address (2,1), the routing may be continued in the direction the data is traveling, e.g., from physical address (2,1) data may continue to physical address (3,1) which is also virtual address (2,1). The following section may expand on this example.

4.2.1 Example Routing with Virtual Address a. Route physical address (1,1) to physical address (2,1). The data may start at virtual address (1, 1) which in this situation may also be physical address (1,1) due to no physical rows or columns being removed at the origin. After comparing the virtual address (1,1) of the current tile with the destination virtual address of (3,4), it may be determined the data needs to be routed to physical address (2,1), and the data may be routed to physical address (2,1).

b. Route physical address (2,1) to physical address (3,1). Physical tile (2,1) may recognize that it is not a valid virtual address, e.g., due to virtual address of 0, and may determine the data should be routed to physical address (3,1). The data may be routed to physical address (3,1). The physical address (3,1) may also be the virtual address (2,1).

c. Route physical address (3,1) to physical address (4,1). After comparing the virtual address (2,1), which may also be physical address (3,1), of the current tile with the destination virtual address of (3,4), it may be determined the data needs to be routed to physical address (4,1), which may be virtual address (3,1), and the data may be routed to physical address (4,1).

d. Route physical address (4,1) to physical address (4,2). After comparing the virtual address (3,1) of the current tile, which may also be physical address (4,1), with the destination virtual address of (3,4), it may be determined the data is now in the destination column, i.e., virtual column 3, and the data now needs to be routed to physical address (4,2), which may be virtual address (3,2). The data may be routed to physical address (4,2).

e. Route physical address (4,2) to physical address (4,3). After comparing the virtual address (3,2) of the current tile, which may also be physical address (4,2), with the destination virtual address of (3,4), it may be determined the data needs to be routed to physical address (4,3), which may be virtual address (3,3), and the data may be routed to physical address (4,3).

f. Route physical address (4,3) to physical address (4,4). After comparing the virtual address (3,3) of the current tile, which may also be physical address (4,3), with the destination virtual address of (3,4), it may be determined the data needs to be routed to physical address (4,4), which may be virtual address (3,4), and the data may be routed to physical address (4,4).

g. Destination reached at physical address (4,4). After comparing the virtual address (3,4) of the current tile, which may also be physical address (4,4), with the destination virtual address of (3,4), it may be determined that the destination has been reached and step S330 may be executed.

4.3 Destination Tile Process Data

Optionally, or alternatively, S330, which includes destination tile processing the data, may function to process the data which may include creating more data to be routed to another tile.

5. Computer Program Product(s) Implementing Intelligence Processing

The systems and methods of the preferred embodiments and variations thereof can be embodied and/or implemented at least in part as a machine configured to receive a computer-readable medium storing computer-readable instructions. The instructions are preferably executed by computer-executable components preferably integrated with the system and one or more portions of the processors and/or the controllers. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods described herein.

As a person skilled in the art will recognize from the previous detailed description and from the figures and claims, modifications and changes can be made to the preferred embodiments of the invention without departing from the scope of this invention defined in the following claims.

What is claimed is:

1. A method for virtually addressing an array of computing tiles, the method comprising:
    virtually addressing a plurality of distinct computing tiles of an integrated circuit, wherein the virtually addressing includes:
        (i) assigning a distinct valid virtual address to each distinct non-defective computing tile within the plurality of distinct computing tiles; and
        (ii) disabling each defective computing tile within the plurality of distinct computing tiles,
        wherein each distinct non-defective computing tile and each defective computing tile of the plurality of distinct computing tiles has a distinct physical tile address within the integrated circuit.

2. The method according to claim 1, wherein
the distinct valid virtual address enables a routing, using a virtual address map, of data to each distinct non-defective computing tile.

3. The method according to claim 1, further comprising:
    enabling routing of data along the integrated circuit based on a virtual address map, the virtual address map including:
        (a) a physical n-dimensional coordinate along the integrated circuit for each distinct non-defective computing tile, and
        (b) a virtual n-dimensional coordinate along the integrated circuit for each distinct non-defective computing tile.

4. A method for dually addressing an array of computing tiles of an integrated circuit, the method comprising:
    dually addressing one or more of a plurality of computing tiles arranged along an integrated circuit, wherein dually addressing includes:
        (i) assigning a distinct physical tile address to each of the plurality of computing tiles along the integrated circuit;
        (ii) assigning a valid virtual address to each distinct computing tile within a portion of the plurality of computing tiles; and
        (iii) disabling each distinct computing tile within a distinct portion of the plurality of computing tiles.

5. The method according to claim 4, wherein:
the disabling includes assigning an invalid virtual address to each distinct computing tile within a distinct portion; and
the null virtual address renders each distinct computing tile within the distinct potion unreachable via virtual addressing using a data packet routing algorithm.

6. The method according to claim 5, wherein
each distinct physical tile address comprises a physical n-dimensional coordinate of the integrated circuit, and
the null address comprises a virtual n-dimensional coordinate.

7. The method according to claim 4, wherein
the valid virtual address renders each distinct computing tile within the portion reachable via virtual addressing using a data packet routing algorithm.

8. The method according to claim 4, wherein:
the disabling includes assigning a null virtual address to each distinct computing tile within a distinct portion; and
assigning the null address includes setting a same value as a null virtual address coordinate at each of a plurality of distinct computing tiles within the distinct portion.

9. A method for virtually addressing computing tiles of an integrated circuit, the method comprising:
    identifying one or more of a plurality of distinct computing tiles as a subset of disabled computing tiles;
    identifying one or more of the plurality of distinct computing tiles as a subset of non-defective computing tiles;
    wherein each of the plurality of distinct computing tiles is associated with a distinct physical address along an integrated circuit;
    virtually addressing the plurality of distinct computing tiles including:
        (i) assigning a distinct valid virtual address to each distinct computing tile within the subset of non-defective computing tiles; and
        (ii) bypassing an assignment of the distinct valid virtual address to each computing tile within the subset of disabled computing tiles.

10. The method according to claim 9, wherein
the distinct valid virtual address enables a routing, using a virtual address map, of data along the subset of non-defective computing tiles.

11. The method according to claim 10, wherein:
the disabling includes assigning an invalid virtual address to each defective computing tile; and
the invalid virtual address disables a routing, using a virtual address map, of data to each defective computing tile.

12. The method according to claim 9, further comprising:
assigning an invalid virtual address to each computing tile with the subset of disabled computing tiles,
wherein the invalid virtual address disables a routing, using a virtual address map, of data along the subset of non-defective computing tiles using the invalid virtual address.

13. The method according to claim 9, further comprising:
assigning an invalid virtual address to each computing tile with the subset of disabled computing tiles,
wherein the invalid virtual address comprises a null address that set a disabled computing tile within the subset of disabled computing tile to a virtually offline state preventing a routing of data to each of the one or more of the plurality of distinct computing tiles of the subset of disabled computing tiles when using virtual addressing.

14. The method according to claim 9, further comprising:
assigning an invalid virtual address to each computing tile with the subset of disabled computing tiles,
wherein the invalid virtual address comprises a null virtual address causing a given disabled computing tile having the null virtual address to continue to pass a data packet traveling in a first direction to a neighboring computing tile along the first direction.

15. The method according to claim 9, further comprising:
implementing a defect agnostic routing algorithm that acknowledges non-defective computing tiles as virtually addressable computing tiles and ignores the disabled computing tiles having a null virtual address as non-virtually addressable computing tiles.

16. The method according to claim 9, further comprising:
a defect agnostic routing algorithm implements dual addressing for interchangeably setting either a physical routing address or a virtual routing address for each data packet traveling into the plurality of distinct computing tiles of the integrated circuit.

17. The method according to claim 9, wherein
the virtually addressing the plurality of distinct computing tiles includes:
at manufacture time of the integrated circuit, using one or more fuses to program virtual addresses for the plurality of distinct computing tiles, wherein each of the one or more fuses stores an electrical value corresponding to a distinct virtual address value.

18. The method according to claim 9, further comprising:
assigning an invalid virtual address to each computing tile with the subset of disabled computing tiles, wherein
the invalid virtual address sets each computing tile within the subset of disabled computing tiles to a virtually offline state preventing a routing of data to each of the subset of disabled computing tiles.

19. The method according to claim 9, further comprising
using one or more fuses to program addresses for the plurality of distinct computing tiles, wherein each of the one or more fuses stores an electrical value corresponding to a distinct address value.

20. The method according to claim 9, further comprising:
a routing algorithm implements data packet addressing based on virtually addressed computing tiles and disabled computing tiles along the integrated circuit.

* * * * *